United States Patent [19]

Higa et al.

[11] 4,171,517
[45] Oct. 16, 1979

[54] APPARATUS FOR SYNCHRONIZATION CONTROL OF A PLURALITY OF INVERTERS

[75] Inventors: Osamu Higa; Nagataka Seki, both of Fuchu, Japan

[73] Assignee: Tokyo Shibaura Electric Company, Limited, Tokyo, Japan

[21] Appl. No.: 762,279

[22] Filed: Jan. 25, 1977

[51] Int. Cl.$^2$ .......................... H03K 17/00; H03K 5/20
[52] U.S. Cl. ...................................... 328/72; 328/111; 307/269; 307/265
[58] Field of Search .................... 328/72, 394, 111, 63; 307/269, 266–268; 363/27, 41

[56] References Cited

U.S. PATENT DOCUMENTS

| | | | |
|---|---|---|---|
| 3,518,456 | 6/1970 | Mauduit et al. | 328/63 |
| 3,624,486 | 11/1971 | Oates | 363/41 |
| 3,753,135 | 8/1973 | Kastner et al. | 328/111 |
| 3,792,362 | 2/1974 | Grant | 328/72 |
| 4,017,744 | 4/1977 | Johnson | 307/69 |

Primary Examiner—Stanley D. Miller, Jr.
Assistant Examiner—B. P. Davis
Attorney, Agent, or Firm—Oblon, Fisher, Spivak, McClelland & Maier

[57] ABSTRACT

In controlled apparatus in which the output pulses of a common reference oscillator are the reference signals of a plurality of inverters, a synchronizing signal generated once in each cycle is added to the output pulses of the common reference oscillator. A respective control apparatus provided for each inverter detects the synchronizing signal from these output pulses to which the synchronizing signal has been added, and by this means phase matching of the outputs of the inverters is effected.

8 Claims, 4 Drawing Figures

APPARATUS FOR SYNCHRONIZATION CONTROL OF A PLURALITY OF INVERTERS

BACKGROUND OF THE INVENTION

1. Field of the Invention

This invention relates to an apparatus for the synchronization control of a plurality of inverters, in which the phases of the gate control signals of inverters operated in parallel are matched with one another so as to effect synchronization of a plurality of inverters.

2. Description of the Prior Art

In an uninterrupted stable power supply using inverters, the method of operating a plurality of inverters in parallel is adopted in order to improve the reliability of the system. With this method, if a fault occurs in one of the inverters the faulty inverter can be disconnected from the load so that stable power can be supplied to the load, and also the required number of inverters can be started and operated according to the load demand.

In a system of this kind, the phases of the outputs of the inverters must coincide both when all of the plurality of inverters are being started and also during steady operation.

SUMMARY OF THE INVENTION

One object of this invention is to provide a unique and novel apparatus for the synchronization control of a plurality of inverters, which can ensure synchronization of the inverters and is highly reliable.

Another object of this invention is to provide an apparatus for the synchronization control of a plurality of inverters, which has a simple structure.

The objects of this invention are achieved by an apparatus for the synchronization control of a plurality of inverters, which comprises a reference oscillator, a synchronizing signal generating circuit which generates synchronizing signals in response to the output of this reference oscillator and supplies an output in which the generated synchronizing signals are added to the output of the reference oscillator, and for each inverter a respective gate control circuit which responds to the output of this synchronization signal generator.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENT

Figure 1:
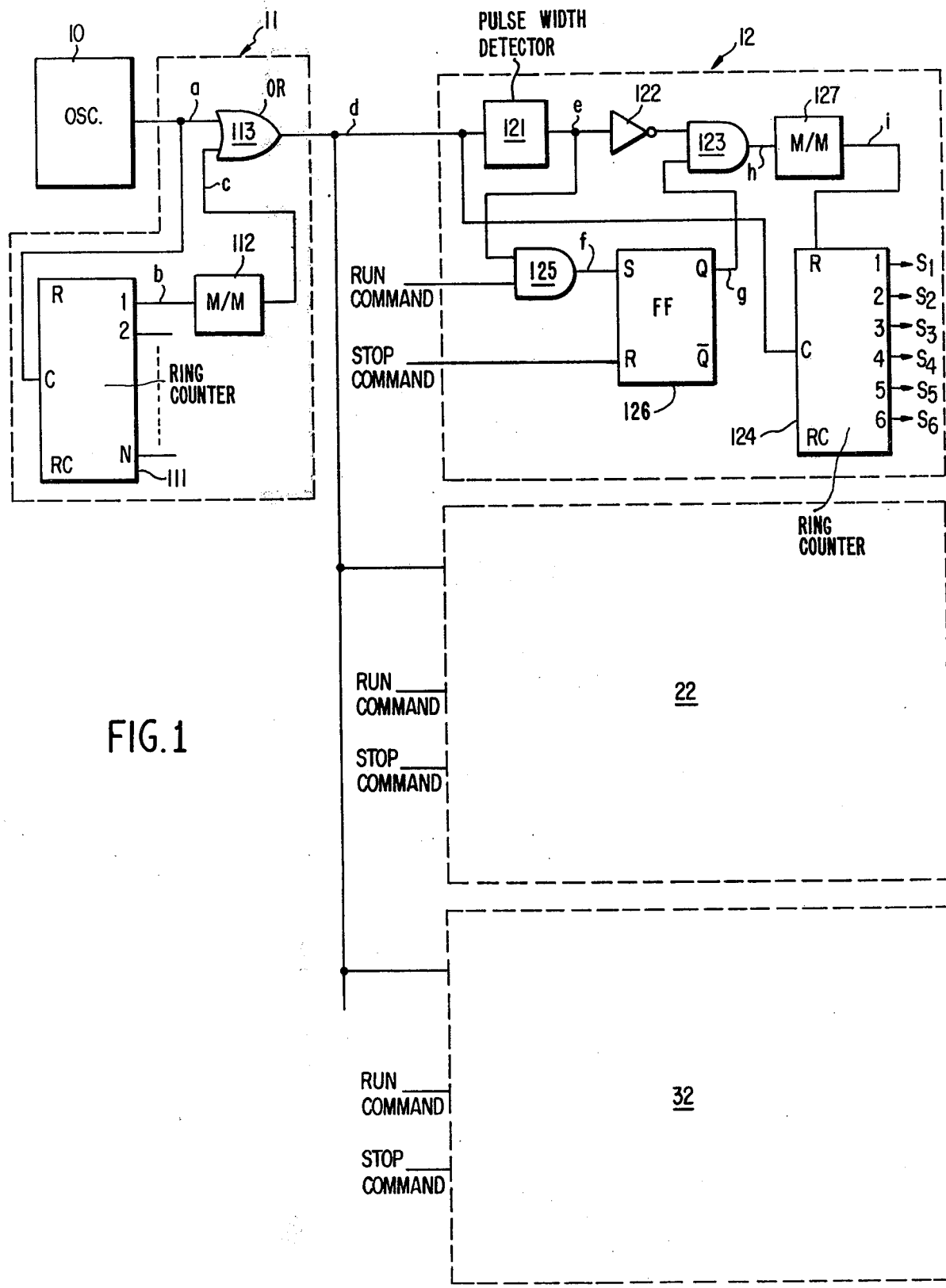
FIG. 1 is a block diagram showing an embodiment of this invention.

Referring now to the drawings, wherein like reference numerals designate identical or corresponding parts throughout the several views, and more particularly to FIG. 1 thereof, the synchronization control apparatus in accordance with the present invention comprises a common reference oscillator 10 for producing the reference signals for a plurality of inverters, a synchronizing signal generating circuit 11 to which the output of this reference oscillator 10 is supplied and which generates synchronizing signals, and a plurality of gate control circuits 12, 22 and 32 which detect the synchronizing signals from the output of this synchronizing signal generating circuit 11 and synchronize the output of the reference oscillator 10 by means of these synchronizing signals and thus generate their outputs. Each of these gate circuits 12, 22 and 32 is an apparatus for sending out gate pulses to a respective one of a plurality of inverters, three in the present instance, which are not shown in the drawings. For the sake of convenience the present description will concern the gate control 12 for an inverter I.

The synchronizing signal generating circuit 11 comprises a "N-ary" ring counter 111 to which the ouput signals of the reference oscillator 10 are supplied as input, a monostable multivibrator circuit 112 to which output signals from a first output terminal of this N-ary ring counter 111 are supplied as input, and which generates an output having a specified width whenever one of these input signals comes in, and an OR gate element 113 which takes the logical sum of the output of this monostable multivibrator circuit 112 and the output of the reference oscillator 10. The number N of this N-ary ring counter 111 differs according to the form and number of phases of the inverters, but here it is assumed that the inverters are 3-phase and that those having the bridge arm structue (6 thyristors) are used, and the number is taken to be 6.

The gate control circuit 12 comprises a synchronizing signal detector circuit and an N-ary ring counter 124; this synchronizing signal detector circuit comprises a pulse width detector circuit 121 for detecting the synchronizing signals from the output signals of the synchronizing signal generating circuit 11, a polarity changing circuit 122 for changing the polarity of the output of the pulse width detector circuit 121, an AND gate element 123 having two input terminals of which one receives the output of this polarity changing circuit 122, and AND gate element 125 to which the output of the pulse width detector circuit 121 and run-command signals are supplied, a flip-flop 126 which has a set terminal receiving as input the output of the AND gate element 125 and which has a reset terminal receiving stop-command signals as input, and of which the output $\bar{Q}$ is supplied to the other output terminal of the AND gate element 123, and a monostable multivibrator circuit 127 which is connected to the output terminal of the AND gate element 123 and of which the output is connected to a reset terminal of the N-ary ring counter.

The output of this synchronizing detector circuit is supplied to the reset terminal of the N-ary ring counter 124. The N-ary ring counter 124, which counts in response to the output of the synchronizing signal generating circuit 11, is cleared by the signals supplied to this reset terminal R.

Figure 2:
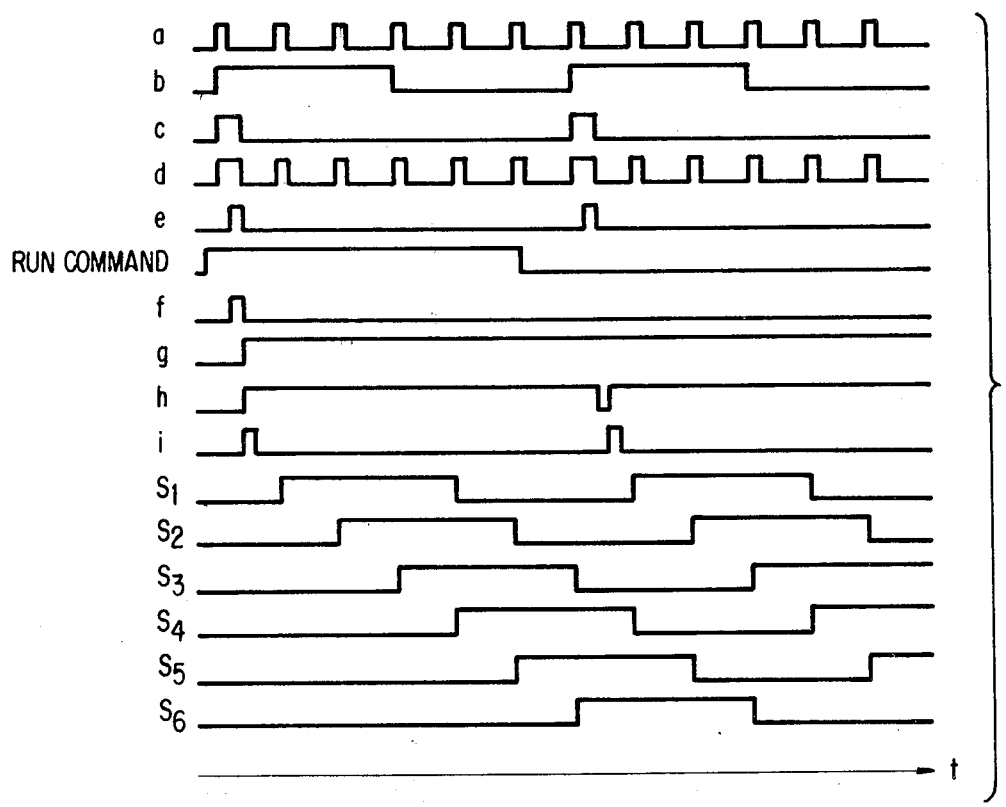
FIG. 2 is a time chart to illustrate the operation of the embodiment shown in FIG. 1.

The following description with reference to FIG. 2 concerns the operation of a synchronization control apparatus according to one embodiment of this invention. That is to say, the description explains how the output of Inverter I can be matched to the phases of the outputs of inverters II and III when inverters II and III, not shown in the drawings, are in operation and inverter I is being started. The process is the same when all of the invertes I, II and III are started simultaneously.

The signal (d) to the gate control circuits 12, 22 and 32 is made by taking, at the OR gate element 113, the logical sum of the pulse sequence, shown at (a), of the reference oscillator 10 and the pulses (c) which are the output (b) from the first terminal of the N-ary ring counter 111 and of which the pulse width is widened by the monostable multivibrator circuit 112.

This pusle signal (d) is a pulse sequence containing a synchronizing pulse of a greater width occurring once in every 6 pulses of the reference signal (a). In other words, this pulse sequence (d) contains two kinds of information, that is to say the frequence reference (a) of the inverters and the synchronizing signal (c).

This pulse signal (d) is applied respectively to the clock input terminal of the N-ary ring counter 124 and to the input terminal of the pulse width detector circuit 121 of the synchronizing signal detector circuit. In a way described hereinafter, the pulse width detector circuit 121 detects only the sychronizing pulses, which have a greater width, out of the pulse sequence (d), and therefore its output becomes the signal (e) shown in FIG. 2. The AND gate element 125 takes the logical product of the output (e) of this pulse width detector circuit 121 and the run-command signal, and the output (f) of this element now generates a signal, and therefore the signal (g) shown in FIG. 2 appears at the Q side of the flip-flop 126.

The output (h) of the AND gate element 123 is obtained by taking the logical product of a signal which is the signal (e) with its polarity changed, and the signal (g). The signal (i) of FIG. 2 is the output (h) of the AND gate element 123, obtained through the intermediary of the monostable multivibrator circuit 127; this signal (i) is used as the reset signal of the N-ary ring counter 124.

As regards the N-ary ring counter 124, after counting the first pulse containing the synchronizing signal as shown in FIG. 2 the ring counter 124 is cleared by the output of the synchronizing signal detector circuit, that is to say by the output signal (i) of the monostable multivibrator circuit 127. After that, the ring counter 124 counts 6 pulses from the second pulse, and the respective outputs are $S_1$ to $S_6$. Now, after the ring counter has counted the 6th pulse, that is to say the pulse containing the synchronizing signal, it is again cleared by the output signal of the monostable multivibrator circuit 127.

Figure 3:
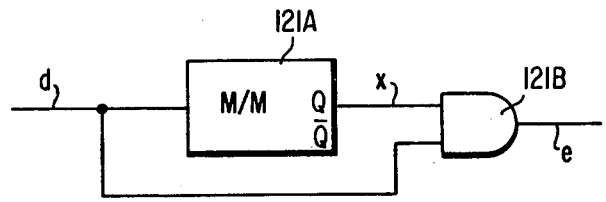
FIG. 3 is a block diagram showing a concrete example of a pulse width detector circuit shown in FIG. 1.
Figure 4:
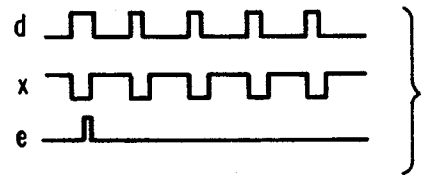
FIG. 4 is a time chart showing the operation of the pulse width detector circuit shown in FIG. 3.

The following is a description, with reference to FIG. 3, concerning a particular circuit structure and manner of operation of the pulse width detector circuit 121.

This pulse width detector circuit 121 comprises a monostable multivibrator circuit 121A having an input terminal to which the input signal (d) is supplied, and an AND gate element 121B which takes the logical product of the output (x) which is the inverted output $\overline{Q}$ of this monostable multivibrator circuit 121A, and the input signal (d). The output time of the monostable multivibrator circuit 121A is made narrower than the width of the synchronizing signal but wider than the width of the pulses generated by the reference oscillator.

By means of this structure it is possible to detect only the synchronizing signals from the output signal (d) of the synchronizing signal generating circuit 11.

Moreover, in the present invention the effects described hereinafter can also be achieved by a structure in which the polarity changing circuit 122, the AND gate element 123, the flip-flop 126 and the monostable multivibrator circuit 127 of the gate control circuit 12 of FIG. 1 are omitted and the output (e) of the pulse width detector circuit 121 is applied to the reset terminal of the N-ary ring counter 124.

Also, as is clear from the above description the synchronizing signal is a pulse of greater width, but if on the contrary it is a pluse of smaller width the present invention can still be carried into effect; the technology of this appears to be well within the grasp of a person skilled in the art and therefore will not be described in detail.

As described above, when the present invention is used the gate control circuits are synchronized in every cycle and therefore not readily affected by faulty operation due to noise or the like.

Also, when an inverter, which is out of operation while the other inverters are operating, is to be started, the signals to the gates of the thyristors of the inverters can be reliably synchronized for all of the inverters, and therefore the phases of the outputs of the inverters can be perfectly matched.

Moreover, there is a single oscillator common to the gate control circuits each provided for a respective inverter, and therefore the structure is simple.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An apparatus for the synchronization control of a plurality of inverters, comprising:
   a reference oscillator;
   synchronizing signal generating means responsive to the output of the reference oscillator for generating distinct synchronizing signals, for adding the generated synchronizing signals to the output of the reference oscillator, and for supplying an output corresponding to the sum thereof; and,
   a plurality of gate control means responsive to the output of the synchronizing signal generator for controlling the gates of the inverters, each gate control means coupled to a respective inverter, and comprising a synchronizing signal detector for detecting synchronizing signals from the output of the synchronizing signal generating means, and a ring counter responsive to output of the synchronizing signal generating circuit means and controlled by the output of the synchronizing signal detector circuit means.

2. An apparatus for the synchronization control of a plurality of inverters, as claimed in claim 1, wherein each of the synchronizing signal detectors includes:
   means for detecting the width of the output of the synchronizing signal generating means.

3. An apparatus for the synchronization control of a plurality of inverters, as claimed in claim 1, wherein each of the synchronizing signal detectors includes:
   a monostable multivibrator; and
   an AND logic gate.

4. An apparatus for the synchronization control of a plurality of inverters, as claimed in claim 3, wherein said synchronzing signal generating means comprises:
   a ring counter connected to and responsive to the output of the reference oscillator a monostable multivibrator connected to and responsive to the output of the ring counter; and, an OR logic gate for taking the logical sum of the output of the monostable multivibrator and the output of the reference oscillator.

5. An apparatus for the synchronization control of a plurality of inverters, comprising:

a reference oscillator;

synchronizing signal generating means responsive to the output of the reference oscillator for generating distinct synchronizing signals and for adding the generated synchronizing signals to the output of the reference oscillator, and for supplying an output corresponding to the sum thereof; and, a plurality of gate control means responsive to the output of the synchronizing signal generator for controlling the gates of the inverters, each gate control means coupled to a respective inverter and comprising means for detecting the synchronizing signals from the output of the synchronizing signal generating means, means for synchronizing the gates of the inverters by means of these detected synchronizing signals, and run command and stop command input terminals.

6. Apparatus for the synchronization control of a plurality of inverters comprising:

a reference oscillator;

synchronizing signal generating means responsive to the output of the reference oscillator for generating distinct synchronizing signals, for adding the generated synchronizing signals to the output of the reference oscillator, and for supplying an output corresponding to the sum thereof, said synchronizing signal generating means including means for generating signals longer than the width of the output signals of the reference oscillator; and a plurality of gate control means responsive to the output of the synchronizing signal generator for controlling the gates of the inverters, each gate control means coupled to a respective inverter, and comprising means for detecting the synchronizing signals from the output of the synchronizing signal generating means, and means for synchronizing the gates of the inverters by means of these detected synchronizing signals.

7. An apparatus for the synchronization control of a plurality of inverters comprising:

a reference oscillator;

synchronizing signal generating means responsive to the output of the reference oscillator for generating distinct synchronizing signals, for adding the generated synchronizing signals to the output of the reference oscillator, and for supplying an output corresponding to the sum thereof, said synchronizing signal generating means including means for generating signals longer than the width of the output signals of the reference oscillator; and a plurality of gate control means responsive to the output of the synchronizinf signal generator for controlling the gates of the inverters, each gate control means coupled to a respective inverter, and comprising means for detecting the synchronizing signals from the output of the synchronizing signal generating means, and means for synchronizing the gates of the inverters by means of these detected synchronizing signals, wherein the synchronizing signal generating circuit means includes a ring counter connected to and responsive to the output of the reference oscillator;

a monostable multivibrator connected to and responsive to the output of this ring counter; and an OR logic gate for taking the logical sum of the output of the monostable multivibrator and the output of the reference oscillator.

8. An apparatus for the synchronization control of a plurality of inverters, comprising:

a reference oscillator;

synchronizing signal generating means responsive to the output of the reference oscillator for generating distinct synchronizing signals, for adding the generated synchronizing signals to the ouput of the reference oscillator, and for supplying an output corresponding to the sum thereof; and, a plurality of gate control means responsive to the output of the synchronizing signal generator for controlling the gates of the inverters, each gate control means coupled to a respective inverter, wherein said synchronizing signal generating means comprises a ring counter connected to and responsive to the output of the reference oscillator;

a monostable multivibrator connected to and responsive to the output of the ring counter; and, an OR logic gate for taking the logical sum of the output of the monostable multivibrator and the output of the reference oscillator; and, wherein each gate control means comprises pulse width detector means for detecting the synchronization signals from the output of the OR logic gate; and a counter controlled by the output of the pulse width detector means and responsive to the output from the OR logic gate.

* * * * *